United States Patent
Grabbe et al.

(10) Patent No.: US 12,308,247 B2
(45) Date of Patent: May 20, 2025

(54) METHODS FOR PROCESSING SEMICONDUCTOR WAFERS HAVING A POLYCRYSTALLINE FINISH

(71) Applicant: GlobalWafers Co., Ltd., Hsinchu (TW)

(72) Inventors: Alexis Grabbe, St. Charles, MO (US); Hui Wang, Wildwood, MO (US); Alex Chu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 376 days.

(21) Appl. No.: 17/234,101

(22) Filed: Apr. 19, 2021

(65) Prior Publication Data

US 2021/0242035 A1   Aug. 5, 2021

Related U.S. Application Data

(63) Continuation of application No. 15/764,272, filed as application No. PCT/US2016/054488 on Sep. 29, 2016, now Pat. No. 11,043,395.

(60) Provisional application No. 62/235,197, filed on Sep. 30, 2015.

(51) Int. Cl.
*H01L 21/321* (2006.01)
*C09G 1/02* (2006.01)
*H01L 21/02* (2006.01)

(52) U.S. Cl.
CPC ............ *H01L 21/3212* (2013.01); *C09G 1/02* (2013.01); *H01L 21/02074* (2013.01); *H01L 21/02532* (2013.01); *H01L 21/02595* (2013.01)

(58) Field of Classification Search
CPC . C09G 1/02; H01L 21/3212; H01L 21/02074; H01L 21/02532; H01L 21/02595
See application file for complete search history.

(56) References Cited

U.S. PATENT DOCUMENTS

| | | | |
|---|---|---|---|
| 4,608,095 A * | 8/1986 | Hill | H01L 21/0262 257/E21.321 |
| 5,232,875 A * | 8/1993 | Tuttle | B24B 37/102 438/959 |
| 5,571,373 A | 11/1996 | Krishna et al. | |
| 5,646,053 A * | 7/1997 | Schepis | H01L 21/3212 257/E21.32 |
| 5,746,829 A | 5/1998 | Matsunaga et al. | |
| 6,139,428 A * | 10/2000 | Drill | B24B 53/12 451/286 |
| 6,162,368 A | 12/2000 | Li et al. | |
| 6,191,039 B1 * | 2/2001 | Chang | H01L 21/3212 438/692 |

(Continued)

FOREIGN PATENT DOCUMENTS

JP    2005072238 A    3/2005

OTHER PUBLICATIONS

Wolf, "Silicon Processing for the VLSI Era, vol. 1—Process Technology," 2000, Lattice Press, second edition, p. 128-129.

*Primary Examiner* — Michelle Mandala
*Assistant Examiner* — Kevin Quinto
(74) *Attorney, Agent, or Firm* — Armstrong Teasdale LLP (57) ABSTRACT

A method of processing a semiconductor wafer includes depositing a silicon layer on the semiconductor wafer. A first slurry is applied to the semiconductor wafer and the silicon layer is polished to smooth the silicon layer. A second slurry is applied to the semiconductor wafer. The second slurry includes a greater amount of a caustic agent than the first slurry.

5 Claims, 12 Drawing Sheets

(56) References Cited

U.S. PATENT DOCUMENTS

| | | | |
|---|---|---|---|
| 6,200,837 B1* | 3/2001 | Ihn | H01L 29/78636 |
| | | | 257/E29.283 |
| 6,268,284 B1* | 7/2001 | Cerio, Jr. | H01L 21/28568 |
| | | | 257/E21.585 |
| 6,431,959 B1 | 8/2002 | Mikhaylich et al. | |
| 6,447,693 B1 | 9/2002 | Pryor | |
| 6,559,040 B1 | 6/2003 | Yu et al. | |
| 6,682,396 B1* | 1/2004 | Shih | B24B 37/24 |
| | | | 451/5 |
| 8,062,547 B2 | 11/2011 | Palk et al. | |
| 8,377,825 B2 | 2/2013 | Bankatitis et al. | |
| 2003/0054648 A1* | 3/2003 | Jeong | H01L 21/76826 |
| | | | 438/692 |
| 2004/0140569 A1* | 7/2004 | Meguro | H01L 23/5223 |
| | | | 257/776 |
| 2004/0253775 A1* | 12/2004 | Achuthan | H01L 29/66795 |
| | | | 438/692 |
| 2005/0158478 A1 | 7/2005 | Katsuoka et al. | |
| 2006/0046371 A1 | 3/2006 | Moon | |
| 2006/0088976 A1 | 4/2006 | Sin et al. | |
| 2007/0148978 A1* | 6/2007 | Han | B24B 37/044 |
| | | | 438/692 |
| 2011/0207327 A1 | 8/2011 | Suzuki et al. | |

* cited by examiner

METHODS FOR PROCESSING SEMICONDUCTOR WAFERS HAVING A POLYCRYSTALLINE FINISH

CROSS-REFERENCE TO RELATED APPLICATIONS

This application is a continuation of U.S. patent application Ser. No. 15/764,272, filed Mar. 28, 2018, which is the 35 U.S.C. § 371 national stage of International Patent Application No. PCT/US2016/054488, filed Sep. 29, 2016, which claims priority to U.S. Provisional Application No. 62/235,197, filed Sep. 30, 2015, each of which is hereby incorporated herein by reference in its entirety.

FIELD

This disclosure relates generally to processing semiconductor wafers and more particularly to systems and methods for processing semiconductor wafers including polishing surfaces of semiconductor wafers.

BACKGROUND

Semiconductor wafers are used in the production of semiconductor devices such as integrated circuit (IC) chips, silicon-on-insulator (SOI) wafers, and radio frequency-SOI (RF-SOI) wafers. Typically, the semiconductor wafers include a high resistivity substrate that can cause formation of a high conductivity inversion accumulation layer, which hinders the performance of the semiconductor devices.

In some processes, a layer, such as a polycrystalline silicon layer, is deposited onto a surface of the semiconductor wafer to provide a density charge trap and, thereby, inhibit the formation of the high conductivity inversion accumulation layer. For example, the layer can be deposited onto a surface that forms the interface between the high resistivity substrate and a buried oxide (BOX) to hinder the movement of charges across the interface. Once deposited, the layer tends to form a rough surface on the semiconductor wafer. Therefore, the rough surface of the semiconductor wafer needs to be further processed to have characteristics that meet the strict parameters for production of semiconductor devices, such as IC chips, SOI wafers, and RF-SOI wafers.

Typically, surfaces of semiconductor wafers are polished to improve surface characteristics including polycrystalline layer roughness and micro-defects. One way to polish a semiconductor wafer is referred to as chemical-mechanical polishing (CMP). CMP processes often use a circular polishing pad. The pad is rotated and the wafer is brought into contact with and forced against the pad as a slurry is applied to the pad. However, the wafer can unevenly contact the pad due to a warp or bow, which may be formed when the polycrystalline layer is deposited on the wafer. Such uneven contact impacts surface characteristics after polishing, which might cause the wafer to be unsatisfactory or require additional processing. For example, the wafer may taper at a high rate due to uneven contact between the pad and the wafer.

Sometimes, slurries used in CMP processes include a caustic agent. However, the caustic agent can negatively impact surface characteristics of the wafer. For example, the caustic agent may decorate grain boundaries of the polycrystalline layer causing the wafer to be unsatisfactory or require additional processing. The decorated grain boundaries can form defects that impact the integrity of the semiconductor wafer during further processing such as during bonding of the semiconductor wafer.

Accordingly, there is a need for a method to polish semiconductor wafers that increases the uniformity of pad contact and reduces the damaging effect of caustic agents.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a method of processing a semiconductor wafer includes depositing a silicon layer on the semiconductor wafer. A first slurry is applied to the semiconductor wafer and the silicon layer is polished to smooth the silicon layer. A second slurry is applied to the semiconductor wafer. The second slurry includes a greater amount of a caustic agent than the first slurry.

In another aspect, a method of processing a semiconductor wafer includes depositing a silicon layer on the semiconductor wafer. The semiconductor wafer is positioned on a first wafer polishing apparatus. The silicon layer is polished while the semiconductor wafer is positioned on the first wafer polishing apparatus such that a portion of the silicon layer is removed. The semiconductor wafer is positioned on a second wafer polishing apparatus. The silicon layer is polished while the semiconductor wafer is positioned on the second wafer polishing apparatus such that a portion of the silicon layer is removed.

In another aspect, a method of processing a semiconductor wafer includes depositing a silicon layer on the semiconductor wafer. The semiconductor wafer is cleaned to facilitate growth on the silicon layer. The semiconductor wafer is polished to smooth the silicon layer after the semiconductor wafer is cleaned.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
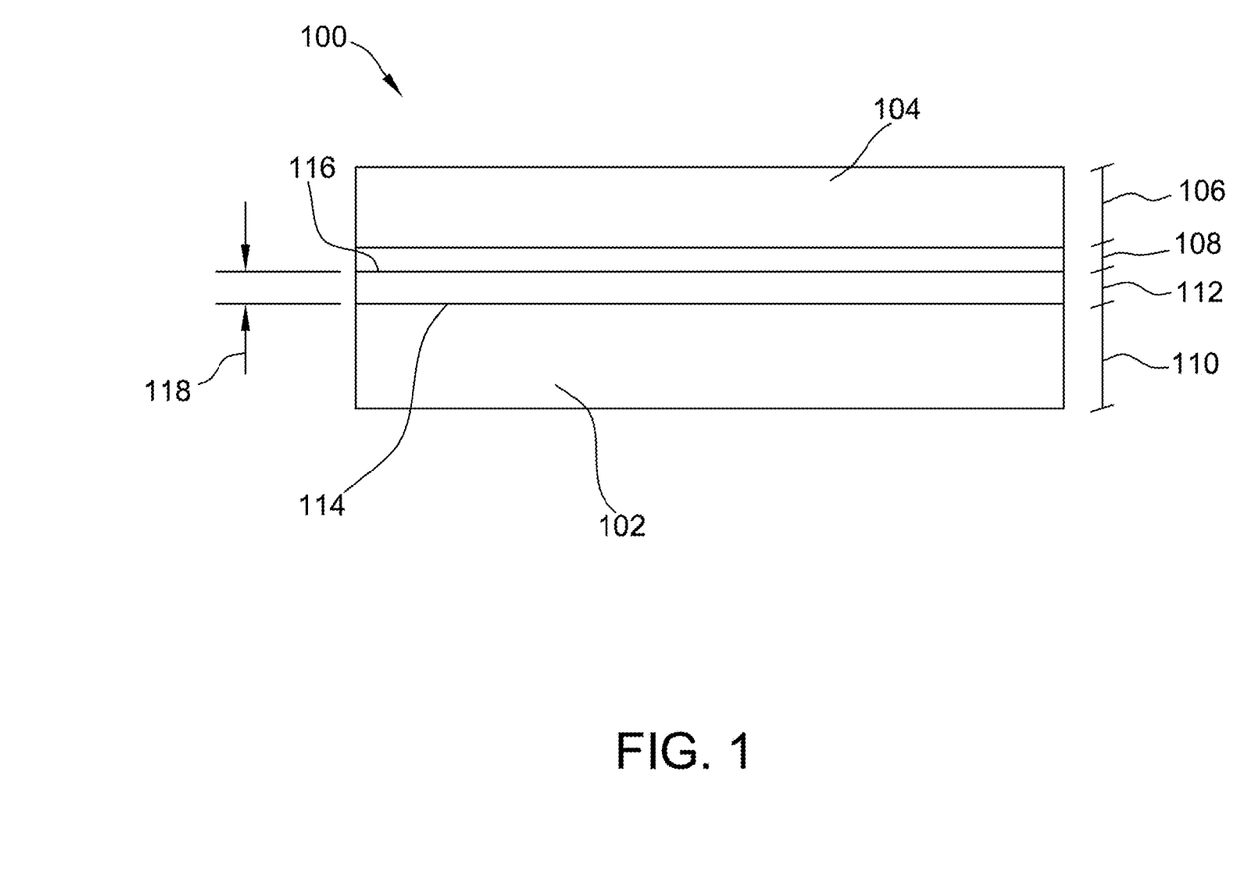
FIG. 1 is cross-section view of one embodiment of a semiconductor wafer.

Referring now to the figures and in particular to FIG. 1, one embodiment of a semiconductor wafer is generally designated in its entirety by the reference number 100. Wafer 100 may be any type of semiconductor wafer and the described methods may be used to polish surfaces of wafers for use in any semiconductor devices, such as integrated circuit (IC) chips, silicon-on-insulator (SOI) wafers, and radio frequency-SOI (RF-SOI) wafers.

In the example embodiment, wafer 100 includes a handle wafer 102 and a donor wafer 104. Donor wafer 104 includes a wafer 106 and an oxide layer 108 disposed on wafer 106. Handle wafer 102 includes a substrate wafer 110 and a silicon layer 112 disposed on substrate wafer 110 and configured to bond to donor wafer 104. Silicon layer 112 includes a substrate surface 114 and a donor surface 116 opposite substrate surface 114. A thickness 118 of silicon layer 112 is measured between substrate surface 114 and donor surface 116. In some embodiments, thickness 118 of silicon layer 112 is in a range between about 1 micrometers and about 5 micrometers, as an example. In other embodiments, silicon layer 112 may have any suitable thickness 118 and cover any portions of wafer 100. In the example embodiments, silicon layer 112 is a polycrystalline silicon layer, which is primarily used as an electron charge trap.

Figure 2:
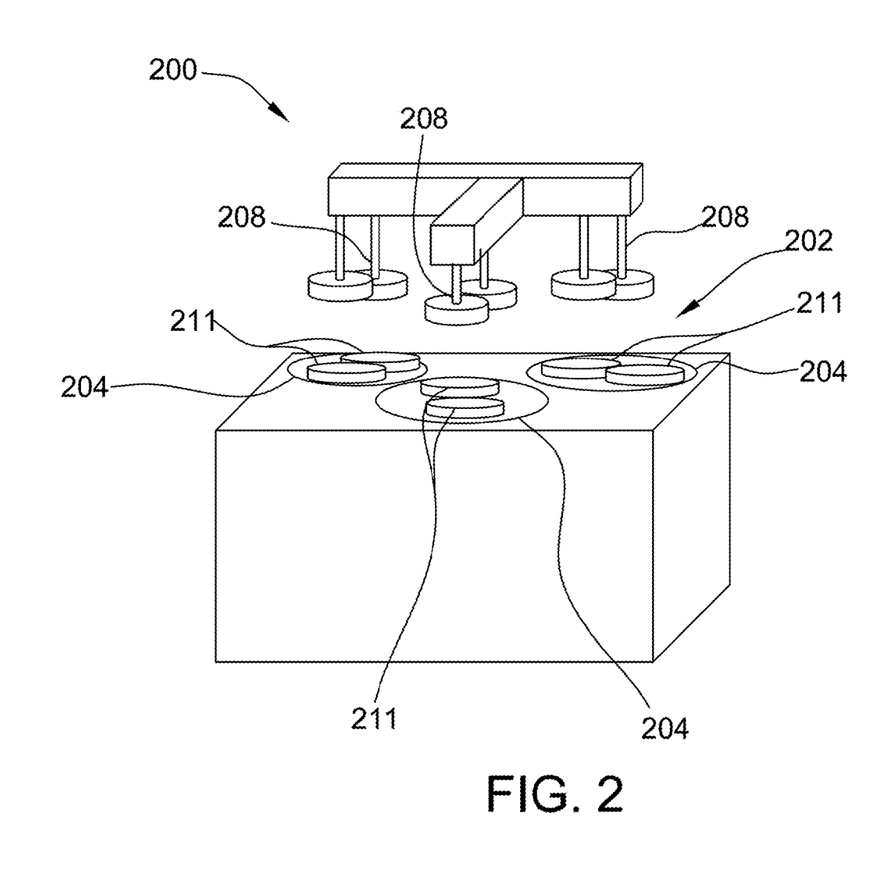
FIG. 2 is a partially schematic perspective view of one embodiment of a wafer polishing system.

In reference to FIG. 2, one embodiment of a wafer polishing system is generally designated in its entirety by the reference number 200. Wafer polishing system 200 includes a plurality of wafer polishing apparatus 202. In suitable embodiments, wafer polishing system 200 may include any number of wafer polishing apparatus 202 that enable wafer polishing system 200 to function as described. In the illustrated embodiment, wafer polishing system 200 includes three wafer polishing apparatus 202.

Figure 3:
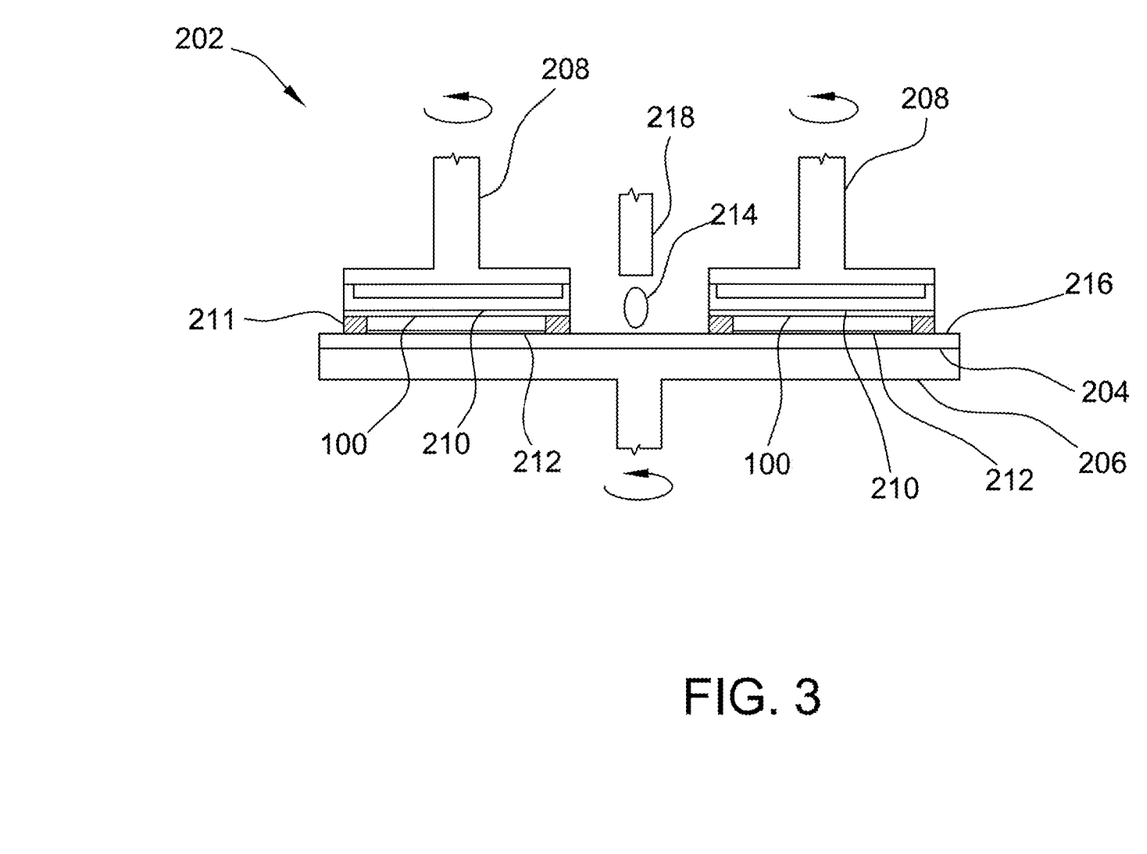
FIG. 3 is a side elevation of one embodiment of a wafer polishing apparatus of the wafer polishing system shown in FIG. 2.

As shown in FIG. 3, wafer polishing apparatus 202 includes a polishing pad 204 mounted on a pivotable table 206 and a wafer mounting device 208 having a rotatable head 210 for mounting semiconductor wafer 100 on polishing pad 204. Rings 211 facilitate positioning wafer 100 in relation to polishing pad 204. In suitable embodiments, wafer polishing apparatus 202 may include any number, including one, of polishing pads 204, wafer mounting devices 208, and rings 211. In the illustrated embodiment, each wafer polishing apparatus 202 includes two wafer mounting devices 208. Wafer mounting device 208 holds wafer 100 and brings wafer 100 into contact with polishing pad 204 as both wafer 100 and polishing pad 204 are rotated. Polishing pad 204 polishes a surface 212 of wafer 100 through abrasion and with a slurry 214 which may be applied to a surface 216 of polishing pad 204. In suitable embodiments, surface 212 may be substrate surface 114 (FIG. 1), donor surface 116 (FIG. 1), or any other surface of wafer 100.

In the illustrated embodiment, each wafer polishing apparatus 202 includes a nozzle 218 for dispensing slurry 214. Any one of nozzles 218 may dispense slurry 214 that differs from slurry 214 dispensed from any other nozzles 218. Additionally, different slurries 214 may be dispensed from any single nozzle 218 during the polishing process.

In the example embodiment, slurry 214 includes a mixture of fluids that facilitates polishing surface 212. Slurry 214 may include any chemicals and other materials that may abrade surface 212. Slurry 214 may also include particles of any size suitable to abrade surface 212 during polishing. In some embodiments, slurry 214 contains particles having diameters between about 20 nanometers and about 80 nanometers, or between about 25 nanometers and about 45 nanometers.

During polishing, slurry 214 is applied between polishing pad 204 and wafer 100 to help polish surface 212 of wafer 100. When polishing pad 204 is pressed against wafer 100, polishing pad 204 works slurry 214 against surface 212 of wafer 100 to concurrently and uniformly remove material from surface 212 of wafer 100 and help improve the overall smoothness of wafer 100. As surface 212 of wafer 100 is polished, silicon is removed and some minor damage is created on surface 212 by the abrasive action of slurry 214. As an example, the intermediate polishing operation removes less than about 1 micrometer of material from surface 212 of wafer 100. The minor damage created by slurry 214 on surface 212 is subsequently removed in final polishing.

Figure 4:
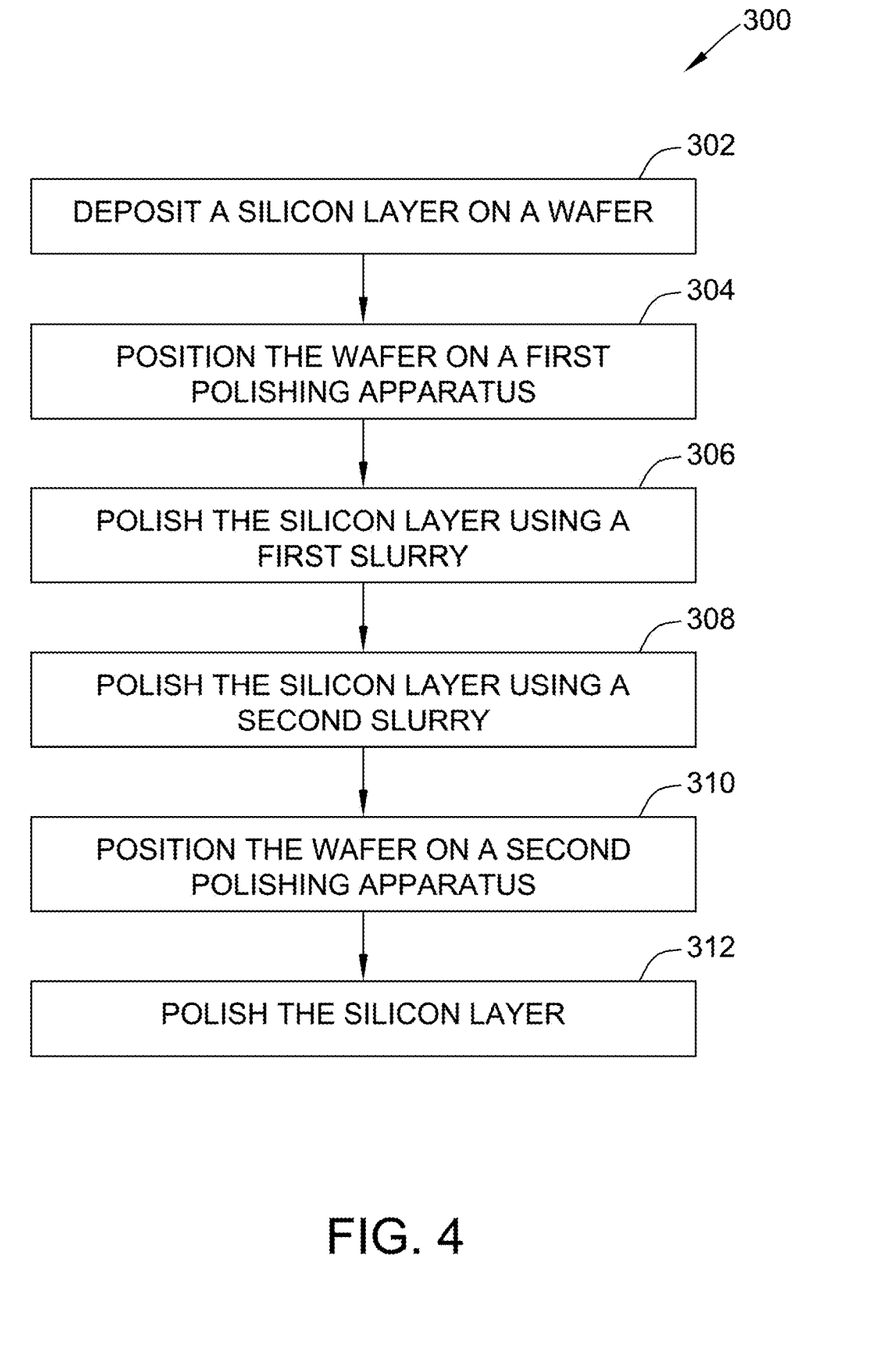
FIG. 4 is a flow diagram showing one embodiment of a method of processing a semiconductor wafer.

FIG. 4 is a flow chart of an example method 300 of polishing semiconductor wafers. Method 300 generally includes depositing 302 silicon layer 112 on wafer 100, positioning 304 wafer 100 on first wafer polishing apparatus 202, polishing 306 silicon layer 112 using first slurry 214, polishing 308 silicon layer 112 using second slurry 214, positioning 310 wafer 100 on second wafer polishing apparatus 202, and polishing 312 silicon layer 112.

In the example embodiment of method 300, polishing is carried out on a plurality of wafer polishing apparatus 202. In some embodiments, wafer 100 may be polished using a single polishing apparatus 202. In the example embodiment of method 300, wafer 100 is positioned 304 on first wafer polishing apparatus 202 for an initial rough polishing. Wafer 100 can be polished on first wafer polishing apparatus 202 for any amount of time suitable for a portion of wafer 100 to be abraded and/or a desired smoothness to be achieved. In some embodiments, wafer 100 is polished on first wafer polishing apparatus 202 such that thickness 118 is decreased by an amount in the range between about 0.3 um and about 1 um. In one embodiment, thickness 118 is decreased by approximately 0.5 um while wafer 100 is polished on first wafer polishing apparatus 202. As a result, the warp and/or bow of wafer 100 is reduced. Additionally, surface stress of silicon layer 112 is released while silicon layer 112 is polished on first wafer polishing apparatus 202.

Reducing warp, bow, and/or surface tension of wafer 100 facilitates polishing pad 204 being pressed against wafer 100 with a substantially uniform pressure during subsequent polishing. In the example embodiment, wafer 100 is positioned 310 on second wafer polishing apparatus 202 for additional polishing. Wafer 100 can be polished on second wafer polishing apparatus 202 for any amount of time suitable for a portion of wafer 100 to be abraded and/or a desired smoothness achieved. In some suitable embodiments, wafer 100 is polished on second wafer polishing apparatus 202 such that thickness 118 is reduced by an amount in the range between about 0.1 um and about 0.5 um. In one embodiment, thickness 118 is decreased by approximately 0.3 um while wafer 100 is polished on second wafer polishing apparatus 202. Due to the reduction of warp, bow, and/or surface tension of wafer 100, material is more uniformly removed from wafer 100 during polishing on second wafer polishing apparatus 202 than during polishing on first wafer polishing apparatus 202.

Buildup of material on polishing pad 204 is reduced by using a plurality of wafer polishing apparatus 202 to polish wafer 100. For example, when switching wafer 100 from first wafer polishing apparatus 202 to second wafer polishing apparatus 202, polishing pad 204 can be cleared of any material remaining on polishing pad 204. Reducing buildup of material on polishing pad 204 increases the lifetime of polishing pad 204 and facilitates polishing pad 204 uniformly removing material during a high volume manufacture process.

In some embodiments of method 300, polishing pad 204 is pressed against wafer 100 and slurry 214 is applied between polishing pad 204 and wafer 100 for a predetermined period of time. The predetermined period of time may be any amount of time suitable for a desired portion of wafer 100 to be abraded and/or a desired smoothness to be achieved. Different slurries 214 may be applied to polishing pad 204 and wafer 100 for different periods of time during polishing. For example, first slurry 214 may be applied to polishing pad 204 and wafer 100 for a period of time in a range between about 1 minute and about 5 minutes, or in some examples, in a range between about 90 seconds and 180 seconds. In one example, first slurry 214 is applied to polishing pad 204 and wafer 100 for approximately 2 minutes during polishing.

To reduce defects on surface 212, such as decorations of grain boundaries, first slurry 214 is substantially free of a caustic agent. In one embodiment, polishing 306 while first slurry 214 is applied to wafer 100 removes between about 0.1 um and about 0.2 um of material. As used in this disclosure, the term "caustic agent" means a substance capable of abrading or removing material by means of a chemical action, such as burning or corroding. In some embodiments, first slurry 214 may include weak caustic agents or relatively small amounts of caustic agents without departing from some aspects of this disclosure.

In method 300, second slurry 214 containing a caustic agent is applied between polishing pad 204 and wafer 100 for further polishing of surface 212 of wafer 100. Second slurry 214 may include any caustic agent suitable to facilitate abrading and/or removing material from wafer 100. In one embodiment, second slurry 214 includes a weak base caustic agent, e.g., without limitation, potassium hydroxide, ammonium hydroxide, tetramethylammonium hydroxide, and amine. An ammonia stabilized colloidal silica slurry is NP8020H. NP8020H has silica content of from about 8 to about 10% and a particle size of from about 65 to about 75 nanometers.

In the example embodiment of method 300, second slurry 214 includes a greater amount of the caustic agent than first slurry 214. In some embodiments, since the caustic agent is a weak base, second slurry 214 has a higher pH than first slurry 214. For example, second slurry 214 may have a pH in the range between about 10 and about 12 and first slurry 214 may have a pH less than about 10. In other embodiments, first slurry 214 and second slurry 214 may have any pH suitable for polishing wafer 100.

In method 300, water is applied to wafer 100 during a final "touch" or "flash" polishing operation to improve sub-micrometer roughness and substantially eliminate minor defects remaining on the surface 212 of wafer 100. The final polishing also maintains the wafer flatness while imparting a smooth, specular finish to surface 212 of wafer 100 typical for polished wafers and desired by many device manufactures. This type of final polish generally removes less than about 1 micrometer of material or between about 0.25 micrometers and about 0.5 micrometers of material from surface 212 of wafer 100. In suitable embodiments, the final polishing removes particles having a diameter less than about 0.12 micrometers or less than about 0.06 micrometers or less than about 0.048 micrometers. The water dilutes slurry 214 as the water is added. In some embodiments, slurry 214 is diluted to about one part silica slurry to about 10 parts deionized water.

Figure 5:
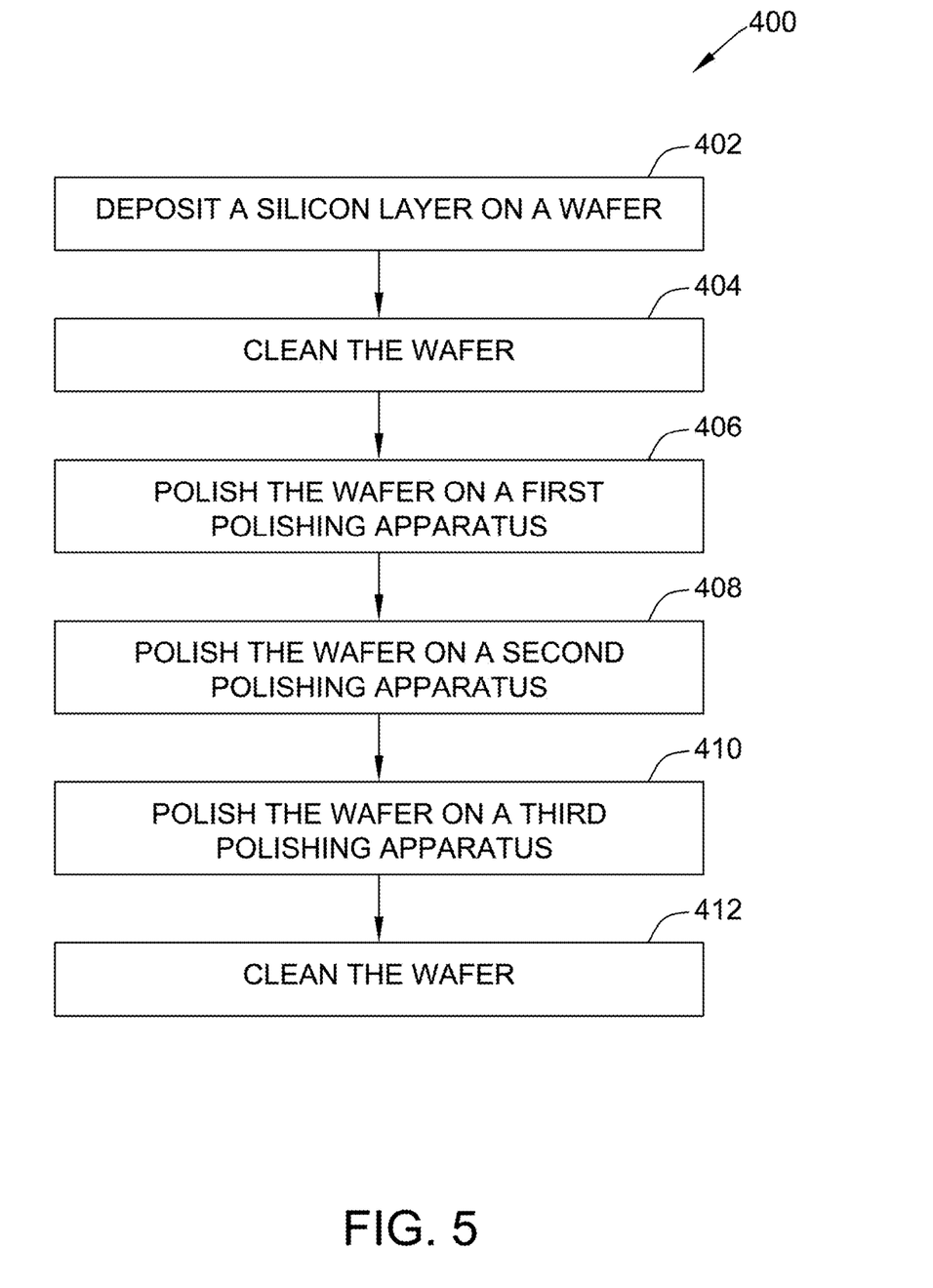
FIG. 5 is a flow diagram showing another embodiment of a method of processing a semiconductor wafer.

FIG. 5 is a flow chart of an example method 400 of processing semiconductor wafers. Method 400 generally includes depositing 402 silicon layer 112 on wafer 100, cleaning 404 wafer 100, polishing 406 wafer 100 on first wafer polishing apparatus 202, polishing 408 wafer 100 on second wafer polishing apparatus 202, polishing 410 wafer 100 on third wafer polishing apparatus 202, and cleaning 412 wafer 100.

In the example embodiment of method 400, cleaning 404 wafer 100 includes treating wafer 100 with a standard clean 1 (SC1) that uses a cleaning solution. In other embodiments, the wafer may be cleaned with any cleaning process. Cleaning the wafer prior to polishing facilitates reducing defects on wafer, protects the rough polysilicon surface and inhibits or avoids aggressive grain boundary decoration. In particular, cleaning the wafer 100 prior to polishing 406, 408, and 410 facilitates the growth of a material layer, such as a silicon oxide layer, on the wafer, which may protect silicon layer 112 and reduce grain boundary decoration.

Figure 6:
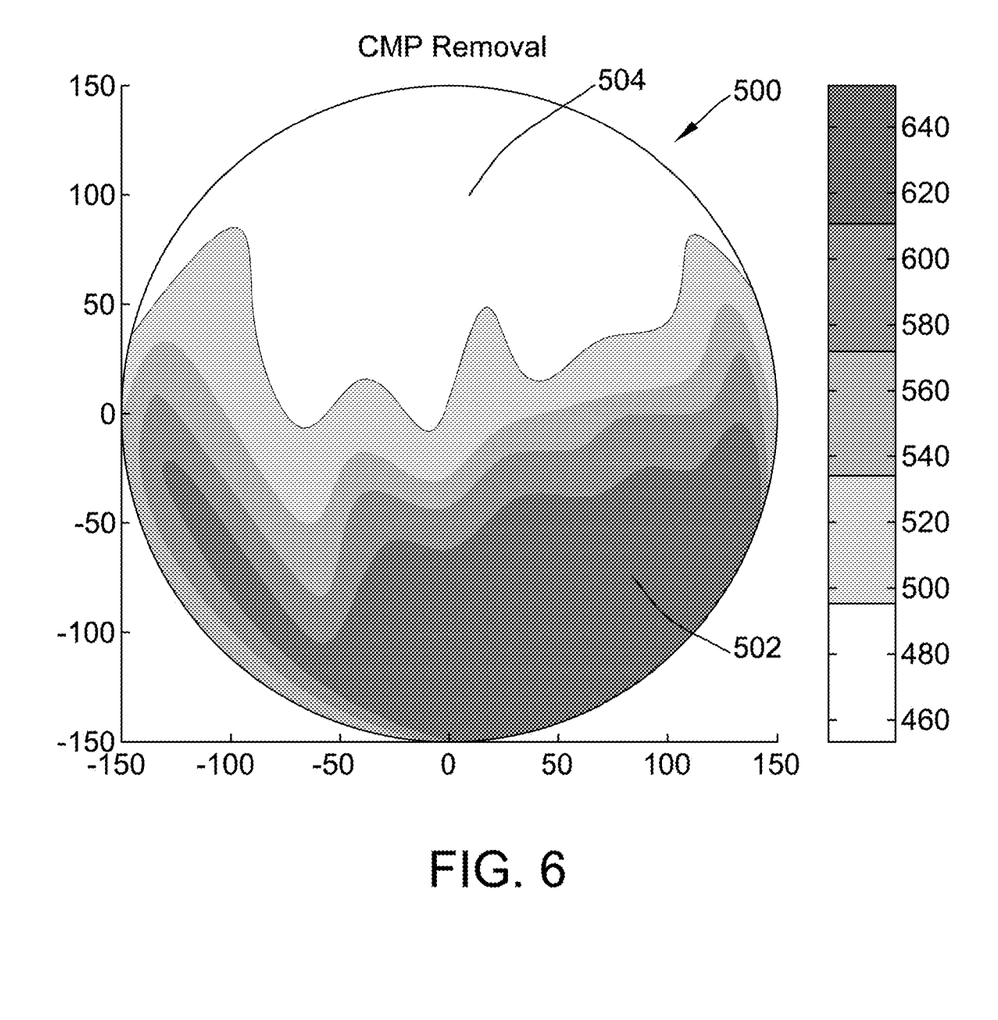
FIG. 6 is an illustration showing the amount of material removed from areas of a wafer during polishing.
Figure 7:
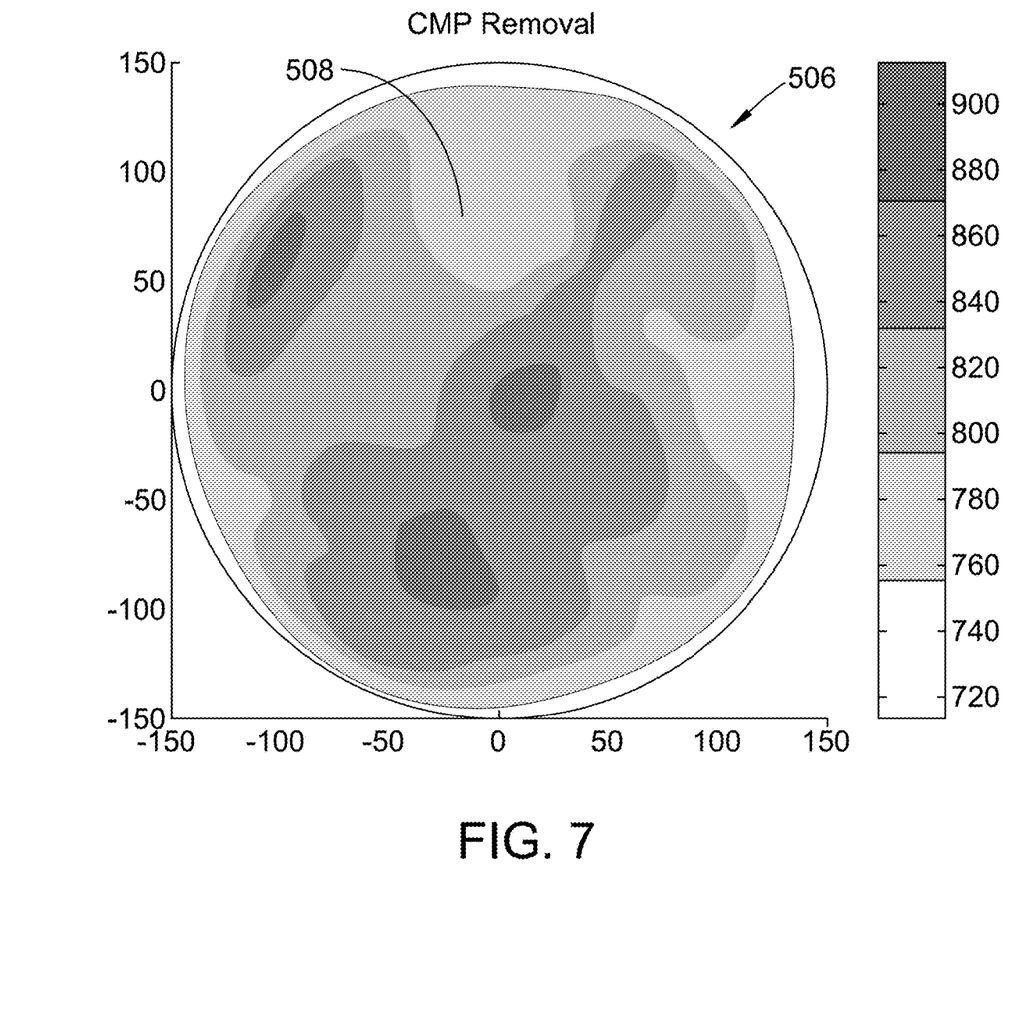
FIG. 7 is an illustration showing the amount of material removed from areas of a wafer during described polishing methods.

As can be seen in FIGS. 6 and 7, the described methods increase the uniformity of material removal during polishing. For example, a wafer 500 shown in FIG. 6 has a substantial taper after polishing, i.e., a greater amount of material has been removed from a low portion 502 than from a high portion 504. Accordingly, wafer 500 may require additional processing and/or not meet the strict requirements for surface characteristics of semiconductor wafers. In contrast, as shown in FIG. 7, material from a wafer 506 is substantially uniformly removed throughout a surface 508 of wafer 506 during the described polishing methods. Approximately 0.8 um of material has been removed from wafer 506, while approximately 0.6 um of material has been removed from wafer 500. Accordingly, the amount of material removed from wafer 506 is greater than the amount of material removed from wafer 500. However, the thickness of wafer 506 after polishing is more uniform than the thickness of wafer 500 after polishing due to the more uniform removal of material during the described polishing methods, which were used for wafer 506.

Figure 8:
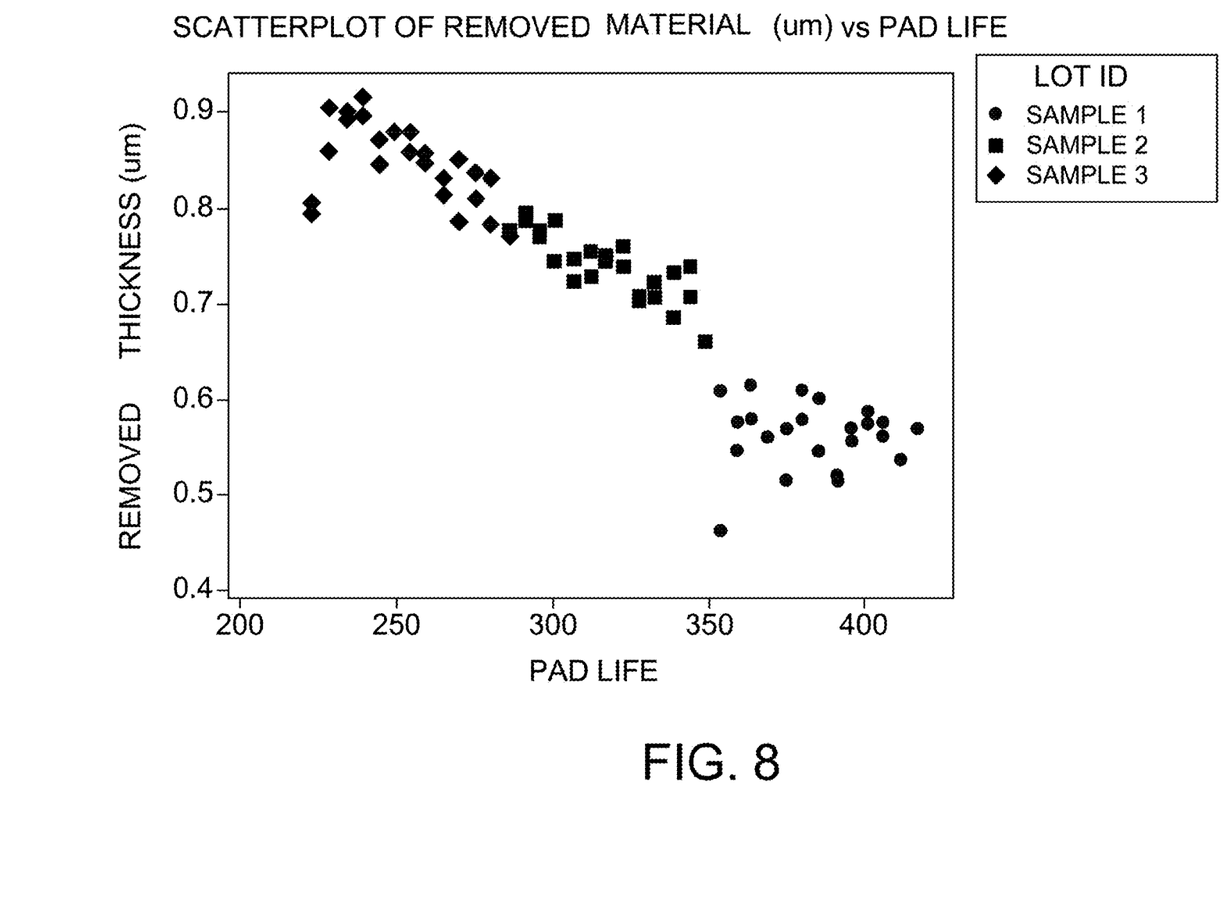
FIG. 8 is a chart comparing the amount of material removed during polishing to the lifetime of polishing pads.
Figure 9:
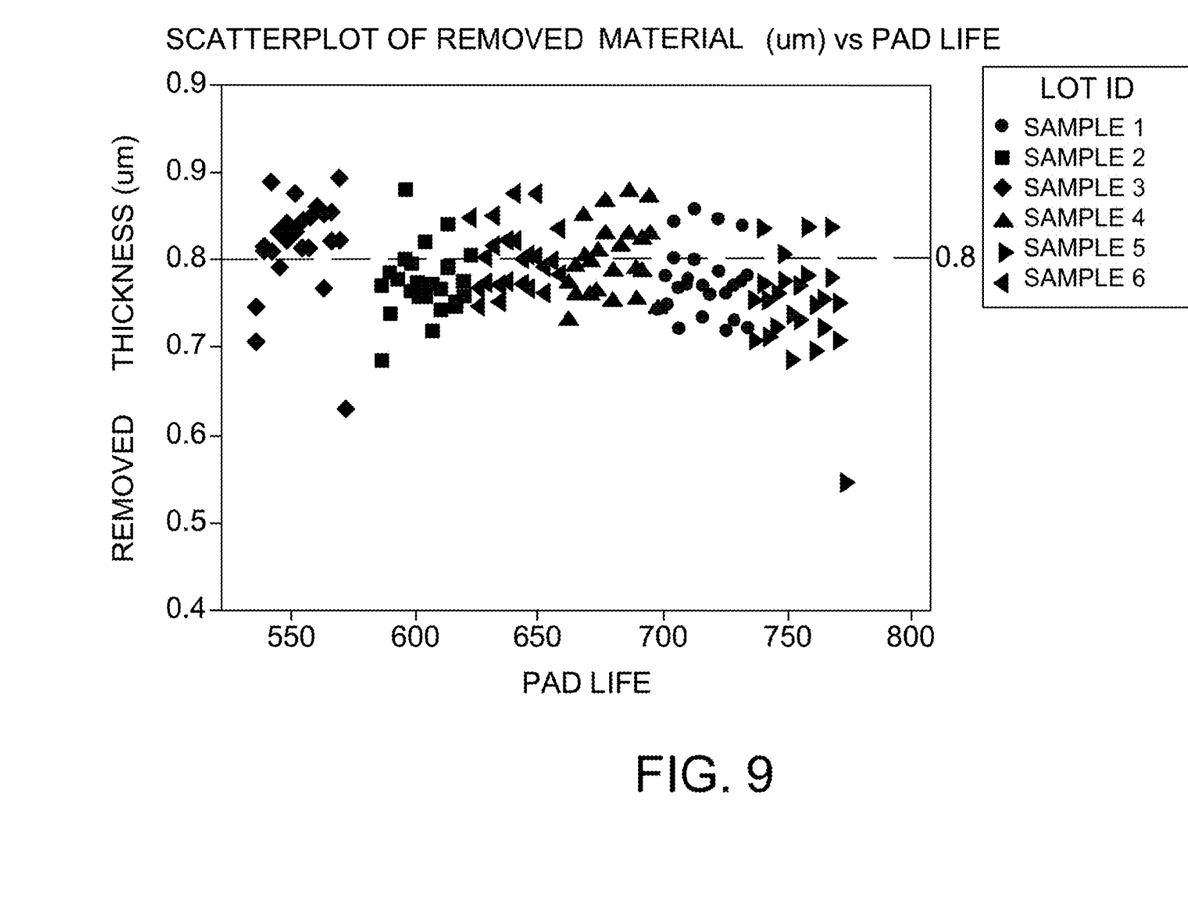
FIG. 9 is a chart comparing the amount of material removed during polishing to the lifetime of polishing pads when the polishing pads are used in described methods.

As shown in FIG. 8, the amount of material removed during polishing typically decreases throughout the lifetime of polishing pad 204. The decrease in removal is due at least partly to the build-up of material on polishing pad 204. However, FIG. 9 shows the removal rate of polishing pads 204 used in the described methods is substantially uniform throughout the life of polishing pads 204.

Figure 10:
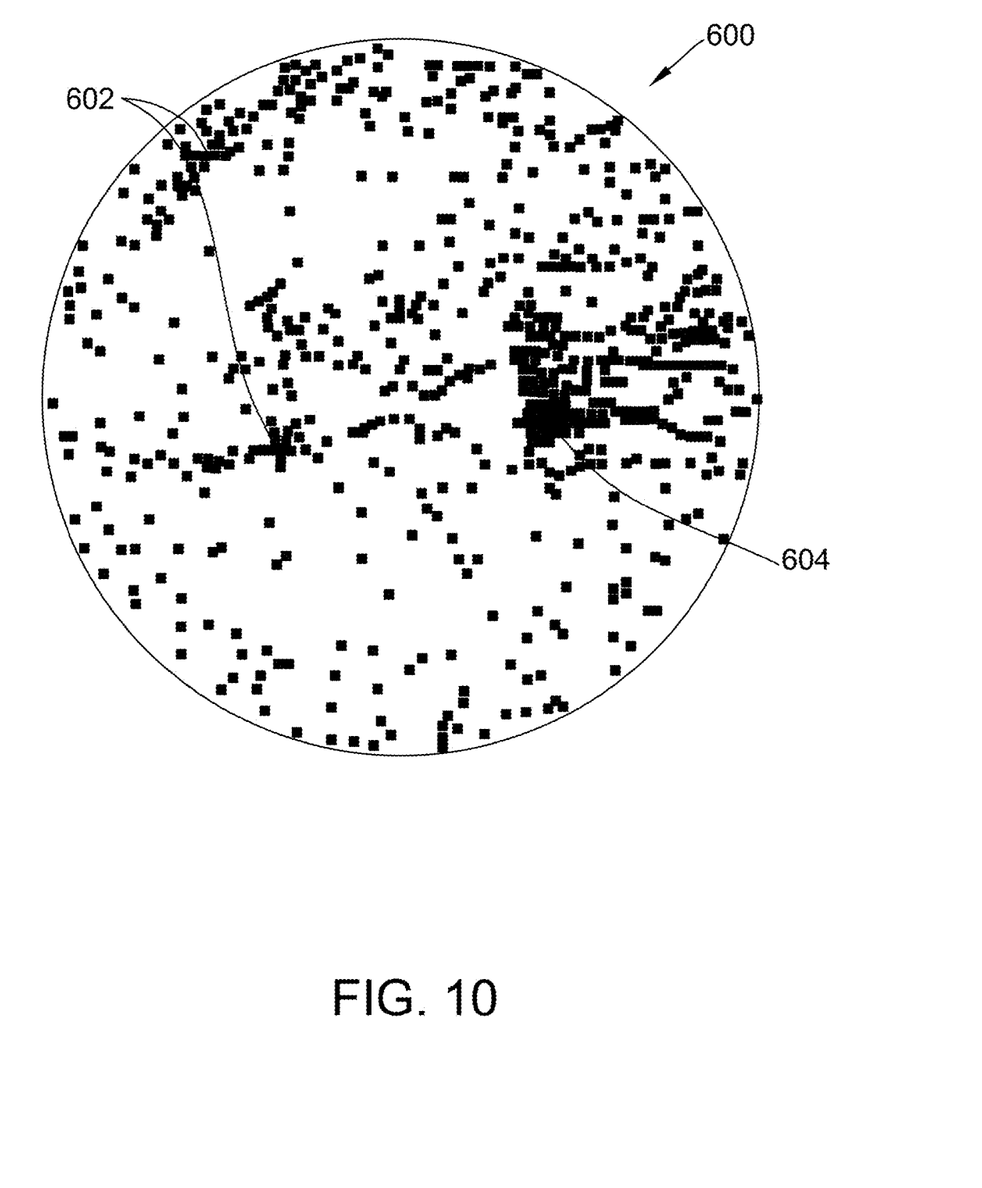
FIG. 10 is an illustration of a semiconductor wafer showing surface defects on the wafer after polishing.
Figure 11:
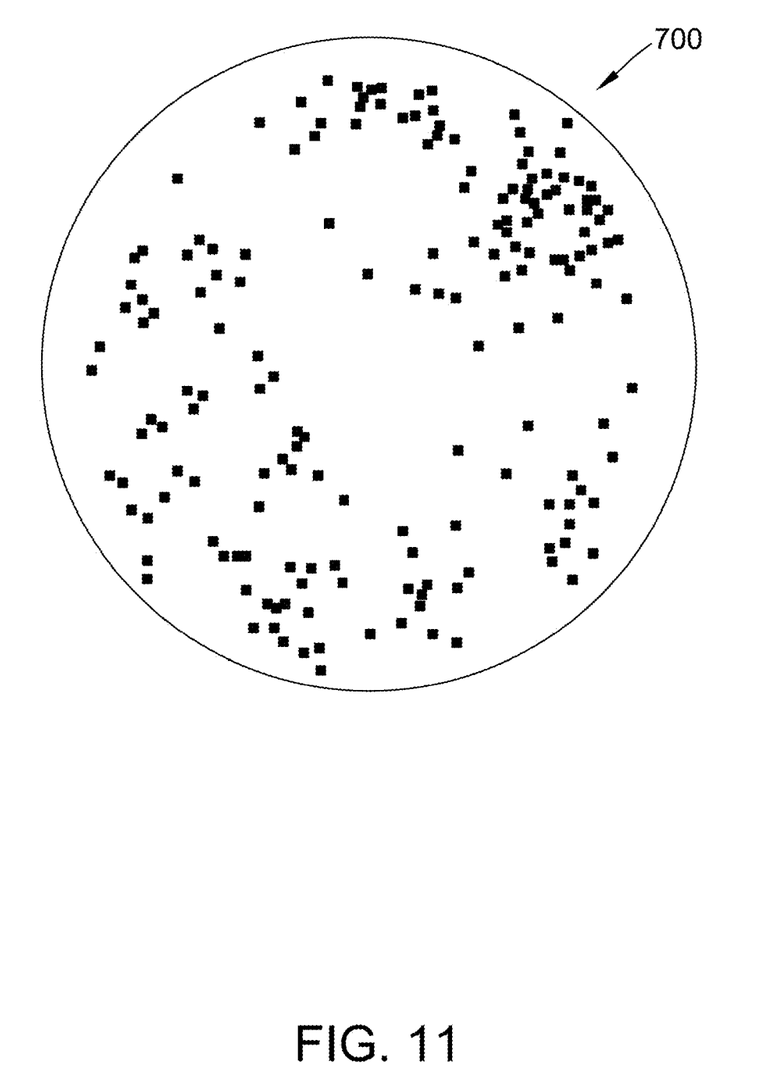
FIG. 11 is an illustration of a semiconductor wafer showing surface defects on the wafer after polishing in accordance with the method shown in FIG. 4.

FIGS. 10 and 11 show Differential Interference Contrast (DIC) images of a wafer 600 and a wafer 700, respectively.

The DIC images highlight surface defects of wafer 600 and wafer 700. Wafer 600 was polished using a single wafer polishing apparatus in a polishing process including a caustic agent. Accordingly, wafer 600 includes defects 602 and decorations 604 on the grain boundary of wafer 600. In contrast, wafer 700 was polished using a plurality of wafer polishing apparatus 202 and with slurry 214 substantially free of caustic agents. As a result, wafer 700 has less surface defects than wafer 600.

Figure 12:
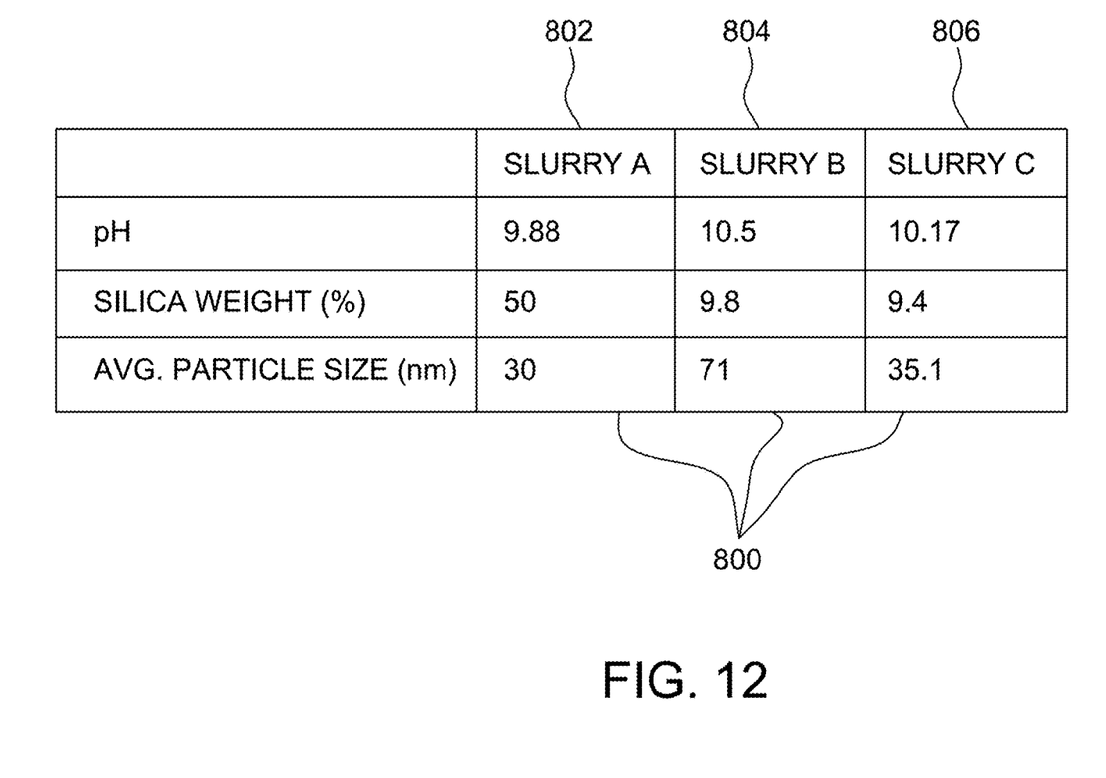
FIG. 12 is a chart comparing the characteristics of slurries for use in processing the wafer.

FIG. 12 is a chart comparing the characteristics of slurries 800 for use in processing wafer 100. Slurry 802 has a pH of approximately 9.88, a silica content of approximately 50%, and an average particle size of approximately 30 nanometers. Slurry 804 has a pH of approximately 10.5, a silica content of approximately 9.8%, and an average particle size of approximately 71 nanometers. Slurry 806 has a pH of approximately 10.17, a silica content of approximately 9.4%, and an average particle size of approximately 35.1 nanometers. A suitable slurry is available from Nalco Company of Naperville, IL.

While a silicon-on-insulator wafer is described in some embodiments, the described methods and systems may be used for polishing any types of wafer, not just silicon-on-insulator wafers.

Embodiments of the methods and systems described may more efficiently produce semiconductor wafers having improved surface characteristics compared to prior methods and systems. For example, the systems and methods described provide an improved polishing system which reduces waste and increases efficiency during wafer polishing. More specifically, the embodiments described provide for polishing a wafer with a plurality of polishing apparatus. The embodiments increase the uniformity of the surface of the polished wafer and reduce taper of the wafer.

In some embodiments, a slurry without a caustic agent is used for an initial portion of the polishing process. As such, the impacts from the caustic agent on rough defects in the wafer are reduced. For example, decoration of the grain boundary by the caustic agent is reduced. Reduced decoration of the grain boundary has a number of benefits, including better surface roughness, less re-generated roughness in downstream processes and improved metrology.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method of processing a semiconductor wafer comprising:
    depositing a silicon layer on the semiconductor wafer;
    positioning the semiconductor wafer on a circular polishing pad of a first wafer polishing apparatus;
    polishing the silicon layer with a first slurry while the semiconductor wafer is positioned on the circular polishing pad of the first wafer polishing apparatus while the circular polishing pad rotates such that a first portion of the silicon layer is removed, the first slurry being free of caustic agent to reduce decoration of a grain boundaries in the silicon layer, wherein the silicon layer is polished with the first slurry for between 1 minute and 5 minutes with between 0.1 µm and 0.2 µm of material being removed from the silicon layer;
    positioning the semiconductor wafer on a second wafer polishing apparatus; and
    polishing the silicon layer with a second slurry comprising a caustic agent while the semiconductor wafer is positioned on the second wafer polishing apparatus such that a second portion of the silicon layer is removed.

2. The method of claim 1 wherein the silicon layer is polished using the second slurry for a predetermined time, the predetermined time being in the range between about 5 minutes and about 15 minutes.

3. The method of claim 1 wherein the caustic agent is potassium hydroxide.

4. The method of claim 1 further comprising forming a silicon oxide layer on the silicon layer prior to polishing the silicon layer.

5. The method of claim 1 wherein the first slurry comprises abrasive particles.

* * * * *